(12) United States Patent
Kant et al.

(10) Patent No.: US 10,948,832 B2
(45) Date of Patent: Mar. 16, 2021

(54) LITHOGRAPHIC METHOD AND APPARATUS

(71) Applicant: ASML Netherlands B.V., Veldhoven (NL)

(72) Inventors: Nick Kant, Utrecht (NL); Robertus Martinus Alphonsus Van Herpen, Eindhoven (NL); Mark Louwrens Beks, Eindhoven (NL); Lense Hendrik-Jan Maria Swaenen, Hoogstraten (BE); Nico Vanroose, Borgerhout (BE); James Robert Downes, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/500,933

(22) PCT Filed: Mar. 6, 2018

(86) PCT No.: PCT/EP2018/055446
§ 371 (c)(1),
(2) Date: Oct. 4, 2019

(87) PCT Pub. No.: WO2018/184783
PCT Pub. Date: Oct. 11, 2018

(65) Prior Publication Data
US 2020/0117092 A1   Apr. 16, 2020

(30) Foreign Application Priority Data

Apr. 6, 2017  (EP) ..................................... 17165195

(51) Int. Cl.
*G03F 7/20*   (2006.01)
(52) U.S. Cl.
CPC .................. *G03F 7/706* (2013.01)

(58) Field of Classification Search
CPC ............................................. G01M 11/0242
See application file for complete search history.

(56) References Cited

U.S. PATENT DOCUMENTS

| 6,563,564 B2 | 5/2003 | de Mol et al. |
| 7,084,952 B2 | 8/2006 | Jeunink et al. |

(Continued)

FOREIGN PATENT DOCUMENTS

| JP | H07-317835 A | 12/1995 |
| JP | 2009-164323 A | 7/2009 |

(Continued)

OTHER PUBLICATIONS

International Search Report and Written Opinion of the International Searching Authority directed to related International Patent Application No. PCT/EP2018/055446, dated Jun. 20. 2018; 12 pages.

(Continued)

*Primary Examiner* — Michelle M Iacoletti
(74) *Attorney, Agent, or Firm* — Sterne. Kessler. Goldstein & Fox P.L.L.C.

(57) ABSTRACT

A method of reducing an aberration arising during operation of a lithographic apparatus, the method comprising measuring the aberration to obtain an aberration signal, the aberration signal comprising a first component and a second component, wherein the first component of the aberration signal comprises a first frequency band and the second component of the aberration signal comprises a second frequency band, wherein the first frequency band comprises frequencies that are higher than frequencies comprised in the second frequency band, calculating a correction, wherein a first part of the correction is calculated based on the first component of the aberration signal, and applying the correction to the lithographic apparatus.

19 Claims, 8 Drawing Sheets

(56) References Cited

U.S. PATENT DOCUMENTS

| | | |
|---|---|---|
| 7,262,831 B2 | 8/2007 | Akhssay et al. |
| 7,626,684 B2 | 12/2009 | Jeunink et al. |
| 8,184,265 B2 | 5/2012 | Wardenier |
| 8,570,485 B2 | 10/2013 | Ye et al. |
| 9,235,136 B2 | 1/2016 | Epple |
| 9,348,232 B2 | 5/2016 | Horn et al. |
| 9,720,335 B2 | 8/2017 | Sakata et al. |
| 9,791,787 B2 | 10/2017 | Baselmans et al. |
| 2009/0237793 A1 | 9/2009 | Koo et al. |
| 2011/0181855 A1* | 7/2011 | Bittner ............... G03F 7/70191 355/55 |
| 2011/0229010 A1 | 9/2011 | Arnz et al. |
| 2012/0257177 A1 | 10/2012 | Zhou et al. |
| 2012/0264066 A1* | 10/2012 | Chen ................ G03F 7/70275 430/322 |
| 2014/0307949 A1 | 10/2014 | Eyring et al. |
| 2015/0323872 A1 | 11/2015 | Van De Kerkhof et al. |
| 2015/0338749 A1* | 11/2015 | Hinnen .................. G03F 1/44 355/55 |

FOREIGN PATENT DOCUMENTS

| | | |
|---|---|---|
| JP | 2010-10687 A | 1/2010 |
| JP | 2011-507294 A | 3/2011 |
| JP | 2014-103343 A | 6/2014 |
| JP | 2015-62256 A | 4/2015 |
| JP | 2015-526755 A | 9/2015 |
| JP | 2015-204366 A | 11/2015 |
| WO | WO 2014/010233 A1 | 1/2014 |
| WO | WO 2016/087388 A1 | 6/2016 |

OTHER PUBLICATIONS

International Preliminary Report on Patentability directed to related International Patent Application No. PCT/EP2018/055446, dated Oct. 8, 2019; 9 pages.

\* cited by examiner

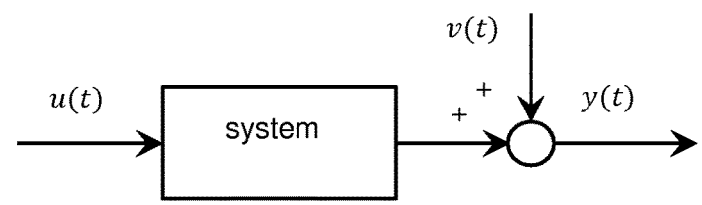
FIG. 2
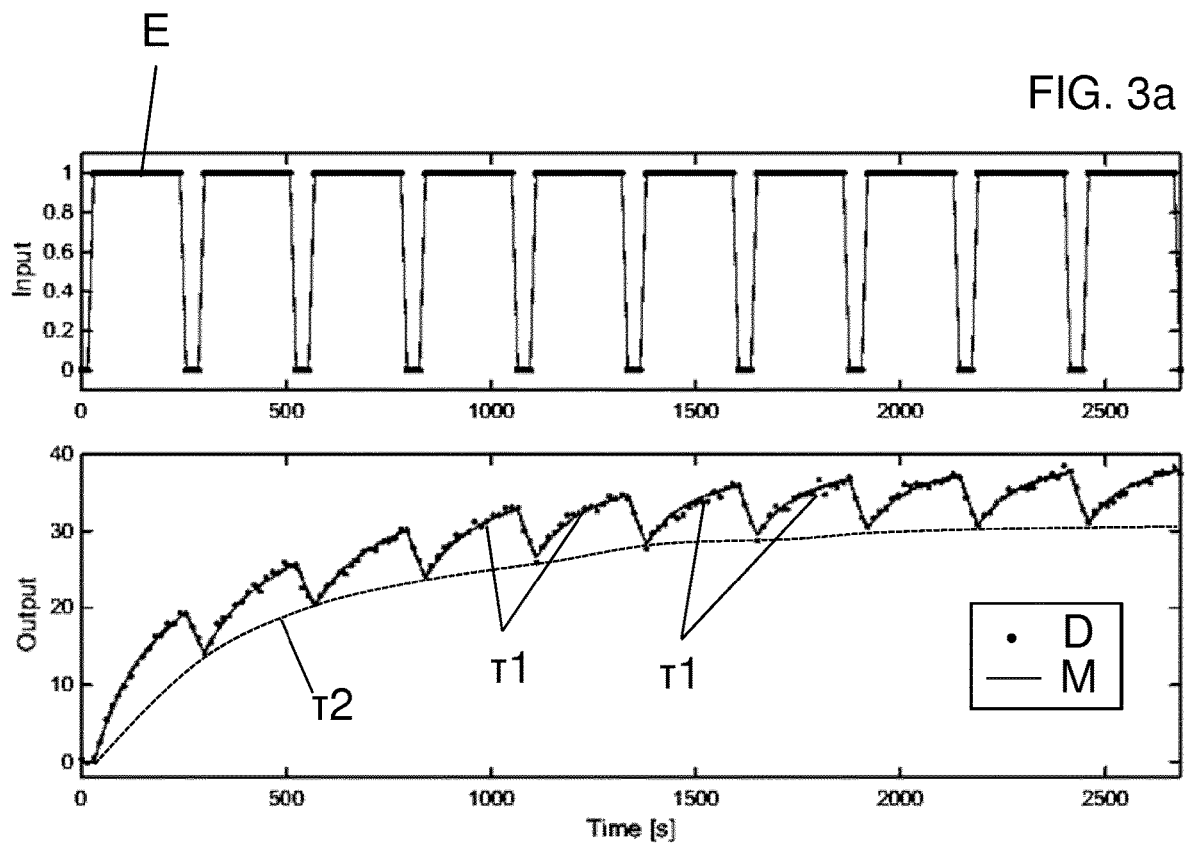
FIG. 3a
FIG. 3b

```
┌─────────────────────────────────┐
│  Measuring the aberration to obtain │
│       an aberration signal          │
│             (1005)                  │
└─────────────────────────────────┘
```

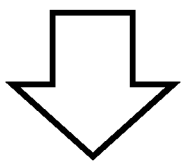

```
┌─────────────────────────────────────────┐
│ Calculating a correction, a first part of the │
│ correction being calculated based on a first  │
│    component of the aberration signal         │
│                 (1010)                        │
└─────────────────────────────────────────┘
```

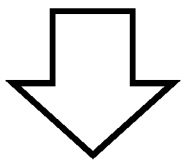

```
┌─────────────────────────────────────────┐
│ Applying the correction to the lithographic │
│              apparatus                      │
│               (1015)                        │
└─────────────────────────────────────────┘
```

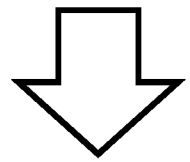

```
┌───────────────────┐
│  Expose substrate │
│      (1020)       │
└───────────────────┘
```

FIG. 4

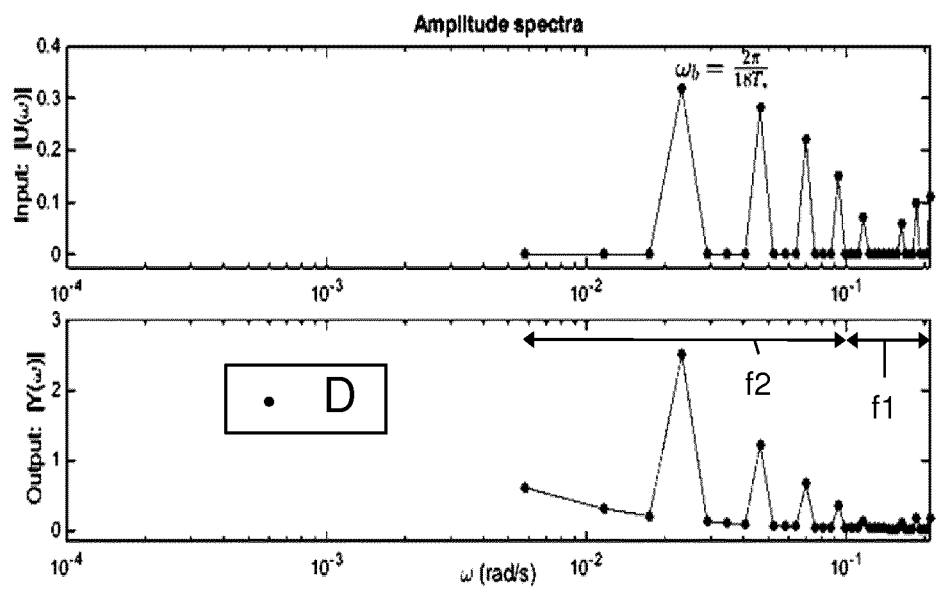
FIG. 5a
FIG. 5b
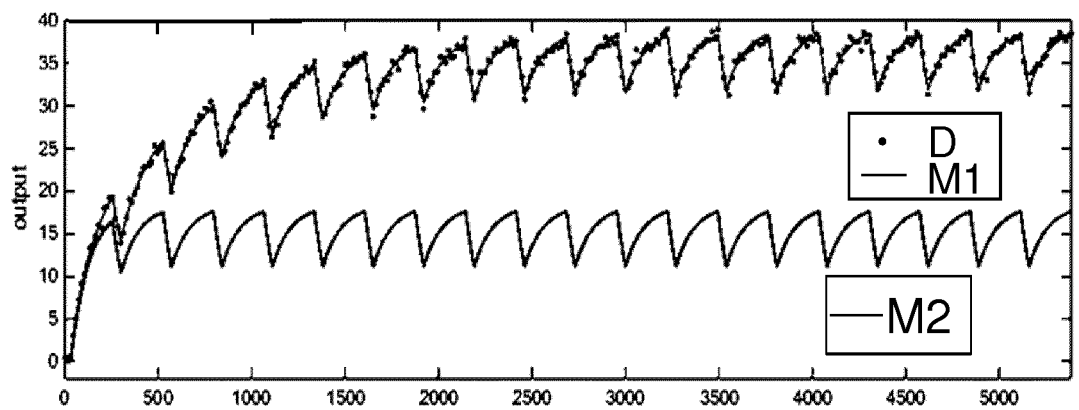
FIG. 6

LITHOGRAPHIC METHOD AND APPARATUS

CROSS-REFERENCE TO RELATED APPLICATIONS

This application claims priority of EP application 17165195.3 which was filed on 6 Apr. 2017 and which is incorporated herein in its entirety by reference.

FIELD

The present invention relates to a lithographic method and apparatus, and particularly but not exclusively to a method of reducing aberrations caused by a projection system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically by using a projection system to image the pattern onto a layer of radiation-sensitive material (resist) provided on the substrate. In general, a single substrate will contain a network of adjacent target portions that are successively patterned.

The projection system which is used to image the pattern onto the substrate will induce some aberrations in the projected image.

It is an object of the invention to provide a method of reducing aberrations which obviates or mitigates a problem associated with the prior art.

SUMMARY

According to a first aspect of the invention there is provided a method of reducing an aberration arising during operation of a lithographic apparatus, the method comprising measuring the aberration to obtain an aberration signal, the aberration signal comprising a first component and a second component, wherein the first component of the aberration signal comprises a first frequency band and the second component of the aberration signal comprises a second frequency band, wherein the first frequency band comprises frequencies that are higher than frequencies comprised in the second frequency band, calculating a correction, wherein a first part of the correction is calculated based on the first component of the aberration signal, and applying the correction to the lithographic apparatus.

The term "first frequency band" may be considered as encompassing at least a part of the first frequency band or all of the first frequency band. The term "second frequency band" may be considered as encompassing at least a part of the second frequency band or all of the second frequency band.

The first frequency band may be indicative of a response of a projection system of the lithographic apparatus during exposure of at least one lot of substrates by the lithographic apparatus.

The second frequency band may be indicative of a response of a/the projection system of the lithographic apparatus to exposure of at least one lot of substrates or a plurality of lots of substrates by the lithographic apparatus.

The method may comprise measuring the aberration during exposure of at least one or at least two lots of substrates by the lithographic apparatus.

The method may comprise measuring the aberration during calibration of the lithographic apparatus.

Calibration of the lithographic apparatus may comprise measuring the aberration for one or more exposure settings of the lithographic apparatus to measure a response of the projection system to the one or more exposure settings.

Measuring the aberration during calibration of the lithographic apparatus may comprise exposing a lot of substrates selected for calibration of the lithographic apparatus.

The method may comprise obtaining or determining the aberration signal from the measured aberration by decomposing the measured aberration into one or more parts or coefficients. The aberration signal may correspond to or be associated with at least one part or coefficient of the measured aberration.

The first frequency band may comprise frequencies above a threshold frequency. The second frequency band may comprise frequencies below the threshold frequency.

The threshold frequency may be selected dependent on a sampling time of the lithographic apparatus.

Calculating the first part of the correction may comprise generating a model using the first component and/or the second component of the aberration signal.

Generating the model may comprise generating the model after a first lot of substrates or a pre-determined number of lots of substrates has been exposed by the lithographic apparatus.

The model may be generated after exposure of the first lot of substrates and/or each lot of substrates that may follow the first lot of substrates using the aberration signal obtained for the first lot of substrates and/or the aberration signal obtained for one or more lots following the first lot of substrates.

Generating the model may comprise generating a new model by recalibrating or updating an existing model using a system identification method.

The generated model may be configured to at least partially predict a response of a/the projection system of the lithographic apparatus during exposure of one or more lots of substrates by the lithographic apparatus.

The generated model may be configured to predict a response of the projection system at a transition between at least two lots of substrates exposed by the lithographic apparatus.

An output generated by the model may comprise the first component of the aberration signal and/or the first frequency band.

The method may comprise using a filter to apply a weighting to the aberration signal prior to calculating the first part of the correction.

A frequency range of the weighting may be selected such that the first part of the correction is calculated based on the first component of the aberration signal and the second component of the aberration signal is suppressed or disregarded for the calculation of the first part of the correction.

The method may comprise using a filter to apply a weighting to the generated model. A frequency range of the weighting may be selected such that a component of the generated model comprising the second frequency band is suppressed or disregarded for the calculation of the first part of the correction.

A/the frequency range of the weighting may comprise minimum frequency that may be equal to or above the threshold frequency. The frequency range of the weighting may comprise a maximum frequency that may comprise a sampling frequency of the lithographic apparatus.

The filter may be or comprise a high-pass filter.

Calculating the correction may comprise calculating a second part of the correction. Calculating the second part of the correction may comprise subtracting the generated output from the aberration signal to obtain a residual.

The residual may comprise or have a frequency that is lower than the frequencies comprised in the first frequency band. The residual may comprise a frequency band comprising frequencies that are lower than the frequencies comprised in the first frequency band.

Calculating the second part of the correction may comprise applying a filter to the residual.

The filter may comprise exponential smoothing or an alpha-beta filter.

Applying the filter to the residual may comprise differentiating the residual to obtain a time derivative of the residual. Applying the filter to the residual may comprise predicting at least a component of an aberration signal for a lot of substrates that may have not yet been exposed by the lithographic apparatus, based on the time derivative of the residual.

Calculating the correction may comprise adding the first part of the correction to the second part of the correction.

Applying the calculated correction to the lithographic apparatus may comprise manipulating lenses of the projection system.

The aberration of the lithographic apparatus may be induced by a/the projection system and/or a mask used by the lithographic apparatus or a distortion thereof.

According to a second aspect of the invention there is provided a method of reducing an aberration arising during operation of a lithographic apparatus, the method comprising measuring the aberration to obtain an aberration signal, the aberration signal comprising a first component and a second component, wherein the first component of the aberration signal comprises a first frequency and the second component of the aberration signal comprises a second frequency, wherein the first frequency is higher than the second frequency, calculating a correction, wherein a first part of the correction is calculated based on the first component of the aberration signal, and applying the correction to the lithographic apparatus.

The first frequency may comprise a frequency that may be above a threshold frequency. The second frequency may comprise a frequency that may be below the threshold frequency.

Any features defined above in relation to the first frequency band may also be applied to the first frequency. Any features defined in relation of the second frequency band may also be applied to the second frequency.

Any optional features set out above in relation to the first aspect of the invention may also be applied to the second aspect of the invention.

According to a third aspect of the invention there is provided a computer program comprising computer readable instructions configured to cause a processor to carry out a method according to the first and/or second aspect of the invention.

According to a fourth aspect of the invention there is provided a computer readable medium carrying a computer program according to third aspect of the invention.

According to a fifth aspect of the invention there is provided a computer apparatus for reducing aberrations caused by a projection system of a lithographic apparatus comprising a memory storing processor readable instructions, and a processor arranged to read and execute instructions stored in said memory, wherein said processor readable instructions comprise instructions arranged to control the computer to carry out a method according to the first and/or second aspect of the invention.

According to a sixth aspect of the invention there is provided a lithographic apparatus comprising a projection system configured to project a pattern from a mask onto a substrate, the lithographic apparatus further comprising a sensor configured to measure an aberration caused by the projection system and/or the mask used by the lithographic apparatus, wherein an aberration signal obtained from the measured aberration comprises a first component and a second component, wherein the first component of the aberration signal comprises a first frequency band and the second component of the aberration signal comprises a second frequency band, wherein the first frequency band comprises frequencies that are higher than frequencies comprised in the second frequency band, a processor configured to calculate a correction to be applied to the projection system, wherein the processor is configured to calculate a first part of the correction based on the first component of the aberration signal, and lens manipulators configured to apply the correction by manipulating lenses of the projection system.

The processor may be further configured to operate according to any of the above described optional parts of the first aspect of the invention.

According to a seventh aspect of the invention there is provided a lithographic apparatus comprising a projection system configured to project a pattern from a mask onto a substrate, the lithographic apparatus further comprising a sensor configured to measure an aberration caused by the projection system and/or the mask used by the lithographic apparatus, wherein an aberration signal obtained from the measured aberration comprises a first component and a second component, wherein the first component of the aberration signal comprises a first frequency and the second component of the aberration signal comprises a second frequency, wherein the first frequency is higher than the second frequency, a processor configured to calculate a correction to be applied to the projection system, wherein the processor is configured to calculate a first part of the correction based on the first component of the aberration signal, and lens manipulators configured to apply the correction by manipulating lenses of the projection system.

The processor may be further configured to operate according to any of the above described optional parts of the second aspect of the invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 schematically depicts a system with inputs and outputs;

FIG. 3a depicts an exemplary exposure sequence of the lithographic apparatus of FIG. 1;

FIG. 3b depicts a comparison between an aberration signal obtained from aberration measurements and an output of a known model;

FIG. 4 depicts a method of reducing an aberration according to an embodiment of the invention;

FIG. 5a depicts an amplitude spectrum of the exposure sequence of FIG. 3a;

FIG. 5b depicts an amplitude spectrum of the aberration signal of FIG. 3b;

FIG. 6 depicts a comparison between an aberration signal obtained from aberration measurements and a model generated by the method of FIG. 4;

DETAILED DESCRIPTION

Figure 1:
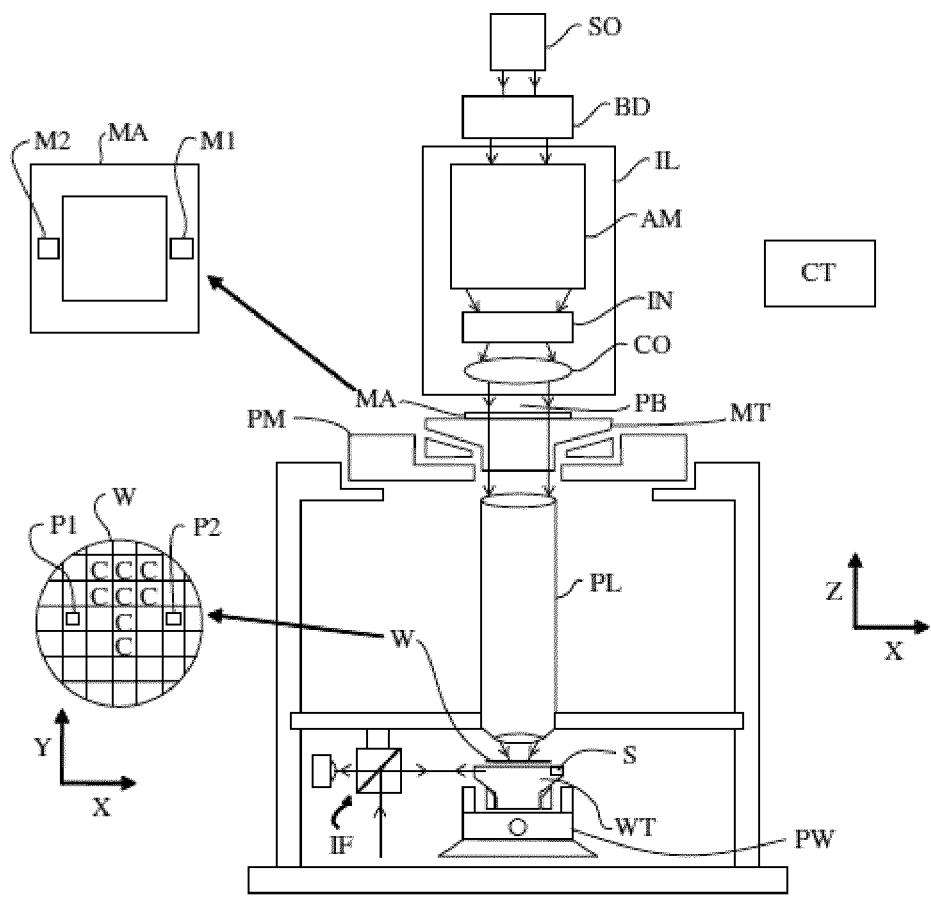
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system". The term "lens" may be used herein as shorthand for "projection lens".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate.

Immersion techniques are well known in the art for increasing the numerical aperture of projection systems.

FIG. 1 schematically depicts a lithographic apparatus according to a particular embodiment of the invention. The apparatus comprises:

- an illumination system IL to condition a beam PB of radiation (e.g. UV radiation).
- a support structure (e.g. a mask table) MT to support a patterning device (e.g. a mask) MA and connected to first positioning device PM to accurately position the patterning device with respect to item PL;
- a substrate table (e.g. a substrate table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise adjusting means AM for adjusting the angular intensity distribution of the beam. The outer and/or inner radial extent (commonly referred to as σ-outer and σ-inner, respectively) of the intensity distribution in a pupil plane of the illumination system can be adjusted. The adjusting means may also be capable of selecting different forms of illumination mode, such as for example a dipole mode or a quadrupole mode. Different forms of illumination mode may be used to project different mask patterns. A combination of an illumination mode and a mask MA may be referred to as an exposure setting. The exposure setting may include other variables such as for example a particular polarisation of the radiation beam PB.

In addition, the illumination system IL generally comprises various other components, such as an integrator IN and a condenser CO. The illumination system provides a conditioned beam of radiation PB, having a desired uniformity and intensity distribution in its cross section. The angular intensity distribution of the radiation beam PB will depend upon the illumination mode that has been selected by the adjusting means AM.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2. In an alternative arrangement (not illustrated) movement of the object tables MT, WT may be controlled by a planar motor and encoder system.

The depicted apparatus may for example be used in a scan mode, in which the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The scanning direction is conventionally referred to as the y-direction of the lithographic apparatus.

A sensor S is provided on the substrate table WT of the lithographic apparatus. The sensor S is configured to measure aberrations in the radiation beam projected by the projection lens PL (which may also be referred to as the projection system). The sensor S may for example comprise an imaging array (e.g. a CCD array) located a few millimetres below a diffraction grating (e.g. comprising several hundred lines). An object marker (not shown) which may for example consist of a few lines printed within a pinhole is provided either on the mask MA or on the mask table MT. In order to perform a measurement of the aberrations caused by the projection lens PL, the mask table MT is moved such that the radiation beam PB illuminates the object marker. The projection lens PL forms an image of the object marker at the substrate table WT. The sensor S is positioned beneath the projection lens PL to capture the far field image of the object marker. A series of object marker images are captured at different positions relative to the XY plane (i.e. different xy-direction positions using the Cartesian coordinates shown in FIG. 1). The images are analyzed by a processor PR to provide measurements of the aberrations which have been introduced into the radiation beam PB by the projection lens PL. The aberrations may for example be expressed as a set of Zernikes. In an embodiment, Zernike coefficients Z2 to Z25 of the field orders offset, tilt, curvature and third order may be used to express the aberrations. Thus, a description of the state of the projection lens may have 96 coefficients (24×4). In alternative embodiments other ranges of Zernike coefficients may be used. For example Zernike coefficients up to $Z_{64}$ may be used, or Zernike coefficients up to $Z_{100}$ may be used.

A set of measurements may be performed with the object marker and sensor S at different x-direction positions along an area which is illuminated by the radiation beam PB (the illuminated area may be referred to an exposure slit). Alternatively, the sensor S may comprise an imaging array (e.g. CCD array) which is sufficiently large to capture an image along the entire x-direction extent of the exposure slit. Where this is the case a set of object markers may be provided at mask level, the object markers being spaced apart along the x-direction of the exposure slit. Aberration measurements are then determined for each object marker of the set. In an embodiment the set of object markers may comprise seven object markers, and thus aberration measurements may be provided at seven positions spaced apart along the x-direction of the exposure slit. In some instances images may be captured away from a central line which bisects the exposure slit (which may correspond with y=0) and are used to provide aberration measurements.

A controller CT is configured to adjust lenses of the projection lens PL in order to correct the aberrations caused by the projection lens PL. Several of the lenses of the projection lens PL may be provided with manipulators which are configured to modify the shape, position and/or orientation of those lenses. The lens manipulators may for example be mechanical actuators which apply compressive or stretching force to edges of a lens, or may for example be heaters which are configured to selectively heat parts of a lens. The effect of modifying the lens shapes, positions and orientations using the manipulators is well-known and thus the lens manipulators can be used to correct the aberration introduced by the projection lens PL in a known way (the lens adjustments and the aberrations may be considered to have a linear relationship). The sensor S, processor PR, controller CT and lens manipulators thus comprise a feedback loop which is used to measure aberrations and to correct measured aberrations. In one example, the sensor S and controller CT determine that a $Z_9$ offset is present. This may be reduced by introducing a linear combination of manipulator adjustments which introduce the opposite $Z_9$ offset. The linear combination of manipulator adjustments is determined by optimizing a merit function (typically a sum of squares of the measured aberrations) by treating the various lens manipulators as the degrees of freedom. If a is a vector containing all manipulator positions and z is a vector containing all the aberrations measured at the different positions in the exposure slit, then the aberrations resulting after a lens adjustment will be z'=z−L.a where L is a matrix containing the 'lens dependencies' (the lens dependencies being a description of the aberrations introduced by each manipulator). A simple example of a solution is the least-squares solution, where z' is minimized treating the vector a as the variable parameter set, giving a_min=(L.L^T)^(−1). L^.z. Solutions other than a least-squares solution may be used.

The feedback loop may thus be used to correct aberrations introduced by the projection lens PL. It may not be possible to entirely remove all aberrations introduced by the projection lens PL. However, reduction of the aberrations such that they fall below thresholds may be sufficient to allow projection of a pattern onto substrates with a desired accuracy using the projection lens PL. References to correction of aberrations is not intended to mean that aberrations are entirely eliminated (this would be impractical). Instead, aberration correction may be interpreted as meaning a projection lens adjustment which reduces (or is intended to reduce) aberrations caused by the projection lens.

The aberration measurement performed using the sensor will include some error. Sources of the error may include limited resolution of the imaging array of the sensor and noise present in the measured image. In some instances, the error in the aberration measurement may be so large that adjusting the lenses of the projection lens PL to correct for apparent aberrations will in fact reduce the accuracy with which patterns are projected onto the substrate. In other words, the aberrations which are caused by the projection lens PL are increased, or at least aberrations which have a significant impact upon the projected pattern are increased such that the accuracy of the projected pattern is reduced.

The projection system which is used to image the pattern onto the substrate will induce some aberrations in the projected image. The aberrations may be due to different properties or settings of the projection system, which may be considered as falling into two groups. The first group relates to the environment of the projection lens, which may include the temperature of the projection lens, the pressure in the projection lens, the differential pressure at different location in the projection lens, and the cooling water temperature. The second group relates to the radiation, which is being projected by the projection lens and may be considered as exposure settings. The second group may include the illumination mode of the radiation beam, e.g. including the polarization mode, and properties of the mask, such as the identity of the mask, diffraction patterns present on the mask and the transmission of the mask.

At least a part of the aberrations may be induced by the projection system. It will be appreciated that the mask or distortions of the mask may induce another part of the aberrations in the projected image. The part of the aberration that is induced by the projection system may be described by modeling lens heating. The part of the aberrations that may be described by modeling lens heating may be caused by heat being delivered to the projection system, for example during exposure of one or more lots of substrates. For example, the part of the aberrations may be caused by thermal expansion of the projection lens, thermal expansion of a coating of the projection lens and/or changes of one or more properties of the projection lens, such as for example a refractive index of the projection lens. A lens heating model may model a response of the projection system to heat being delivered to the projection system, for example during exposure of one or more lots of substrates. The modeling of lens heating may include the use of a system identification method, which is based on measurements of the true system, e.g. the lithographic apparatus. FIG. 2 schematically depicts a system, which may be in the form of the lithographic apparatus, e.g. the projection system thereof. FIG. 2 depicts the system with an input u(t) (e.g. an input relating to the environment of the projection lens and/or exposure settings) and an output y(t) (e.g. one or more aberrations caused by the projection system). The input u(t) that is applied to the system is assumed to be known. However, the resulting outputs y(t) of the system are unknown and need to be measured. The measurements of the output y(t) may include noise v(t), which may be have a Gaussian distribution and may be independent from the input signal.

The relationship between the input and the measured output may be described by a model, such as, for example, a linear time invariant (LTI) model. LTI models may be used to describe aberrations, which are induced by the projection system as a result of heat being delivered to the projection system. LTI models can, for example, be represented by a state-space representation $$\dot{x}(t)=Ax(t)+Bu(t)$$

$$y(t)=Cx(t)+Du(t), \quad (1)$$

in which x(t) are (latent) variables that represent the internal state of the system, $$\dot{x}(t) := \frac{dx}{dt}$$

is the time derivative of x(t). Furthermore, {A, B, C, D} are system or state-space matrices with appropriate dimensions. System identification may include the estimation of one or more parameters of the model from the input and the measured output, e.g., in terms of the system or state-space matrices {A, B, C, D} using subspace identification techniques, prediction error methods and/or output error methods. Subspace identification techniques are, for example, described in Peter Van Overschee and Bart De Moor, *Subspace Identification for Linear Systems: Theory—Implementation—Applications*, Kluwer Academic Publishers, 1996.

An exemplary lens heating model for describing aberrations induced by the projection system may be described by:

$$y(t) = \mu_1\left(1 - e^{\frac{-t}{\tau_1}}\right) + \mu_2\left(1 - e^{\frac{-t}{\tau_2}}\right) \quad (2)$$

in which $\mu_1$, $\mu_2$, are amplitudes and $\tau_1$, $\tau_2$ are time constants. The lens heating model of Equation (2) may be considered as a double exponential heating response of the projection system to heat delivered to the projection system. Equation (2) may be used for modeling lens heating, when a constant heat is applied to the projection system. The heating response of the projection system may form a step-response of a second-order LTI model, with a model structure in terms of the parameters $\{\mu_1, \mu_2, \tau_1, \tau_2\}$. In examples, where the heat applied to the projection system varies, for example when the input to the projection system takes the form of a step or wave function, a random form or includes a chirp, the lens heating may be modelled using a state-space representation, such as for example provided in Equation (1).

It will be appreciated that other lens heating models may be used to describe the aberrations induced by the projection system. Another exemplary model that may be used to describe aberrations induced by the projection system is described in WO16087388 (by the present applicant), which is hereby incorporated by reference.

FIG. 3a depicts an exemplary exposure sequence of the lithographic apparatus, which is shown as a periodic step or block function and referred to as input. Each step may correspond to the exposure of a lot of substrates. Each lot of substrates may comprise about 18 or about 25 substrates. It will be appreciated that in other example more or less than 18 or 25 substrates may be comprised in each lot. During exposure E of a lot of substrates the projection system heats up. Subsequent to exposure E of the lot of substrates, the projection systems cools down. Alternatively or additionally, prior to exposure, the projection system may cool down subsequent to the exposure of a previous lot of substrates. FIG. 3b depicts a comparison between an aberration signal D obtained from aberration measurements, which were, for example, performed by sensor S, and an output M from a lens heating model, for example one of the lens heating models described above. The lens heating model may include the use of the system identification method, which is based on measurements of the lithographic apparatus, e.g. the projection system. The measurements of lithographic apparatus may be performed during calibration of the lithographic apparatus, e.g. when the exposure of production of substrates is interrupted. FIG. 3b depicts that the output M of the lens heating model provides an accurate description of the response of the projection system to heat being delivered to the projection system. The quality/accuracy of the lens heating model depends on measurement data that may be collected during calibration of the lithographic apparatus. Such measurement data may include aberration measurements, for example performed by the sensor S, which are stored with corresponding exposure settings, illumination modes of the radiation beam and/or properties of the mask. For an accurate lens heating model, calibration of the lens heating model may be necessary. For example, a calibration lot of substrates may be used for each exposure setting, e.g. illumination mode or different properties of the mask. For such a calibration, a dedicated measurement sequence may be used to collect data, which may be used for the calibration of the lens heating model. This may impact the availability of the lithographic apparatus for commercial production. In another example, offline computational calibration of the lens heating model may be performed for each exposure setting. In such example, the calibration measurements are generated by an offline physical model to obtain data, which may be used for the calibration of the lens heating model. By using offline computational calibration of the lens heating model, the availability of the lithographic apparatus for commercial production of substrates may not be impacted. However, the accuracy of the lens heating model may be limited as the calibration of the lens heating model is not based on measurements of the lithographic apparatus. In yet another example, inline measurements during production of commercial substrates may be used to calibrate the lens heating model. For an accurate lens heating model measurement of the lithographic apparatus may be performed several days, e.g. up to 3 days. Commercial substrates may be still produced in this example. However, no inline calibrated lens heating model may be available.

FIG. 4 depicts schematically the method according to an embodiment of the invention. The method may be used to reduce an aberration arising during the operation of the lithographic apparatus. In the method of FIG. 4 the aberration measurements are performed, for example, using the sensor S described above. The sensor may be configured to measure the aberration caused by the projection system and/or the mask used by the lithographic apparatus. An aberration signal is obtained from the aberration measurements in step (1005). The aberration signal includes a first component and a second component. As will be described in more detail below, the first component of the aberration signal comprises a first frequency band and the second component of the aberration signal comprises a second frequency band. The first frequency band comprises frequencies that are higher than frequencies comprised in the second frequency band. A correction is calculated in step (1010), for example using a processor, wherein a first part of the correction is calculated based on the first component of the aberration signal. The correction is then applied to the lithographic apparatus (1015). For example, the correction may be applied to the projection system using lens manipulators, as described above. The correction may be designed to reduce the aberrations induced by the projection system and/or the mask used by the lithographic apparatus (or distortions thereof). Once the adjustment of the lithographic apparatus, e.g. the projection system, has been performed, a substrate may be exposed by the lithographic apparatus (1020). The term "first frequency band" may be considered as encompassing at least part of or all of the first frequency band and/or that the term "second frequency band" may be considered as encompassing at least part of or all of the second frequency band. The first frequency band may be or be considered as a high frequency band. The frequency band may be or be considered as a low frequency band.

It will be appreciated that the first component of the aberration signal may alternatively comprise a first frequency, e.g. a first discrete frequency. The second component of the aberration signal may alternatively comprise a second frequency, e.g. a second discrete frequency. The first frequency may be higher than the second frequency. The first frequency may be considered as a high frequency. The second frequency may be considered as a low frequency.

It will appreciated that alternatively the first frequency or the first frequency band may be expressed as a first time constant and/or that the second frequency or the second frequency band may be expressed as a second time constant. The terms "frequency" or "frequency band" and "time constant" may be interchangeably used. For example, in the time domain, a response of a system, e.g. a projection system of a lithographic apparatus, may be expressed by a time constant. In the in the frequency domain (for example, in the Fourier transformation of the response of the projection system) the time constant may determine a frequency or frequency band.

The first frequency band may comprise frequencies that are above a threshold frequency. A minimum frequency of the first frequency band may be or comprise a frequency that is equal to or above the threshold frequency. The second frequency band may comprise frequencies below the threshold frequency. A minimum frequency of the second frequency band may be or comprise 0 rad/s. The threshold frequency may be selected based on a sampling time (e.g. a sampling time per lot of substrates) of the lithographic apparatus. The sampling time may correspond to a time period during which the aberration is measured. Alternatively, the first frequency may be or comprise a frequency that is equal to or above the threshold frequency and the second frequency may be or comprise a frequency that is below the threshold frequency.

The method may comprise obtaining or determining the aberration signal from the measured aberration. It will be appreciated that the term "measured aberration" may be considered a comprising "measured aberration data." The measured aberration may be in the form of an aberrated wavefront/waveform. The measured aberration may be decomposed into one or more parts or coefficients. The obtained aberration signal may be considered as corresponding to or being associated with at least one part or coefficient of the measured aberration. The at least one or each part or coefficient of the measured aberration may comprise or define the first and second components. For example, an aberration may be expressed by a set of Zernike coefficients. An aberrated wavefront of the measured aberration may be fitted, e.g. curve-fitted, with a Zernike polynomial to yield the set of Zernike coefficients. This may allow the measured aberration to be decomposed or into one or more Zernike coefficients. The obtained aberration signal may be considered as corresponding to or being associated with at least one Zernike coefficient. The at least one Zernike coefficient may define or comprise the first and second components. The part of the calculation of the correction, described above, may be based on the first component of the at least one Zernike coefficient. It will be appreciated that in other examples an aberration may be expressed by other methods/models. For example, a Singular Value Decomposition (SVD) method may be used to decompose the measured aberration, e.g. based on a waveform/wavefront of the measured aberration. The measured aberration may be fitted, e.g. curve-fitted, using SVD, e.g. one or more modes generated by the SVD. Each SVD mode may be associated with a part, e.g. an amplitude, of the aberrated wavefront. The obtained aberration signal may be considered as corresponding to or being associated with a part of the aberrated wavefront.

Referring back to FIG. 3b, the aberration signal D, obtained from aberration measurements which were, for example, performed by sensor S. The aberration signal shown in FIG. 3b may in this example be expressed by a Z5 Zernike coefficient and a zero field order. In this figure it can be seen that the aberration signal, e.g. the response of the lithographic apparatus, e.g. projection system, to the exposure sequence depicted in FIG. 3a, can be described by two time constants. As described above, the aberration signal may alternatively be described by two frequencies or frequency bands. The first frequency, frequency band and/or time constant can be considered as being indicative of a response of the projection system during exposure of a lot of substrates by the lithographic apparatus. The first frequency, frequency band and/or time constant may be considered as being indicative of a response of the projection system, e.g. to heat being applied to the projection system, e.g. during exposure of the lot of substrates. The first frequency, frequency band and/or time constant may be considered as describing the fast-heating dynamics of the projection system. The second frequency, frequency band and/or time constant can be considered as being indicative of a response of the projection system of the lithographic apparatus to exposure of at least one or a plurality of lots of substrates by the lithographic apparatus. The second frequency, frequency band and/or time constant may be considered as describing the slow-heating dynamics of the projection system.

Exemplary first and second time constants T1, T2 are indicated in FIG. 3b. The first time constant T1 is visible in FIG. 3b in the response of the projection system to heat during exposure E of each lot. The first time constant may be in the range of about 15 seconds to 100 seconds. The first frequency may be in the range of about 0.06 rad/s to 0.4 rad/s. Alternatively, the first frequency band may comprise frequencies in the range of about 0.06 rad/s to 0.4 rad/s. The second time constant T2 is visible in FIG. 3b across a first set of lots, e.g. the first six lots, before reaching a steady-state value, e.g. across a second set of lots, e.g. the last four lots. The second time constant may be considered as being indicative of the response of the projection system to initial heating, e.g. across the first set of lots. The second time constant may be in the range of about 100 seconds to 2000 second and/or the second frequency may be in the range of about 0.003 rad/s to 0.06 rad/s. Alternatively, the second frequency band may comprise frequencies in the range of about 0.003 rad/s to 0.06 rad/s. After the initial heating of the projection system, the aberration signal may be considered as being dominated by the fast-heating dynamics.

FIGS. 5a and 5b depict the amplitude spectra of the exposure sequence and aberration signal D depicted in FIGS. 3a and 3b, respectively. The amplitude spectrum depicted in FIG. 5a may be considered as the modulus of a Fourier Transformation of the exposure sequence shown in FIG. 3a and the amplitude spectrum depicted in FIG. 5b may be considered as the modulus of the Fourier Transform of the aberration signal D. The amplitude spectra of FIGS. 5a and 5b are indicative of how much of the aberration signal lies within a frequency band or range of frequencies. From FIG. 5b it can be seen that the aberration signal after the first set of lots, e.g. about six lots, of substrates mainly results form an excitation of the high-frequency dynamics of the projection system by the exposure sequence. In other words, the aberration signal may be described by at least two components, wherein the first component comprises the first frequency or frequency band f1 and the second component comprises the second frequency or frequency band f2. The first and second frequencies or frequency bands f1, f2 are indicted by the arrows in FIG. 5b.

FIG. 6 depicts the aberration signal D. The aberration signal D shown in FIG. 6 may in this example be expressed by a Z5 Zernike coefficient and a zero field order. FIG. 6 also depicts the output of one of the lens heating model described above, which is indicated in FIG. 6 as M1. FIG. 6 further depicts the output M2 of a model that was generated as part of the calculation of the correction of the exemplary method depicted in FIG. 4. The calculation of the first part of the correction may include or be part of a system identification method. The calculation of the first part of the correction may use the first component of the aberration signal to generate the model. The system identification method may, for example, use a subspace identification technique, prediction error method and/or output error method to generate the model. The model is referred to in the following as a fast-dynamic model. As can be seen in FIG. 6, the output M2 of the fast-dynamic model has or is characterized by the first frequency, frequency band and/or time constant τ1. It will be appreciated that in other example a model may be generated using the first component and second component of the aberration signal, as will be described below.

The exemplary method may comprise measuring the aberration during exposure of a first lot of substrates by the lithographic apparatus. The fast-dynamic model may be generated after exposure of the first lot of substrates by the lithographic apparatus. In examples, where the aberration was measured for two lots or more than two lots of substrates, the fast-dynamic model may be generated after the first lot of substrates has been exposed by the lithographic apparatus. The fast-dynamic model may be generated after a pre-determined number of lots of substrates, e.g. 4 or 6 lots of substrates, has been exposed by the lithographic apparatus.

The step of generating the fast dynamic model may comprise generating the fast-dynamic model after exposure of the first lot of substrates and/or each lot of substrates that follows the first lot of substrates exposed by the lithographic apparatus using the aberration signal obtained for the first lot of substrates and/or the aberration signal obtained for one or more lots following the first lot of substrates. In other words, the fast-dynamic model may be generated after exposure of the each lot of substrates based on an aberration signal that has been obtained during exposure of that lot of substrates and/or for all previously exposed lots of substrates, an accuracy of the generated model may be improved or increased. By generating the fast-dynamical model after exposure of the each lot of substrates based on an aberration signal that has been obtained during exposure of that lot of substrates and/or for all previously exposed lots of substrates, an accuracy of the generated model may be improved or increased. The fast-dynamic model may be generated using the system identification method, e.g. subspace identification.

In some embodiments, the step of generating the model may comprise recalibrating or updating the fast-dynamic model. For example, a new fast-dynamic model may be generated by recalibrating or updating an existing fast-dynamic model. The existing fast-dynamic model may have been generated during a previous application of the lithographic apparatus or after exposure of one or more previous lots of substrates. The new fast-dynamic model may be recalibrated or updated using a system identification method, such as for example output prediction error and/or prediction error method. In this example, the existing fast-dynamic model may be used as an initial model to start the system identification method with. By recalibrating or updating the model, differences between successively generated fast-dynamic models may decrease and the quality/accuracy of the fast-dynamic model may be improved. Alternatively, the existing fast-dynamic model may be recalibrated or updated using a newly obtained aberration signal.

It will be appreciated that alternatively or additionally the aberration may be measured during calibration of the lithographic apparatus. Calibration of the lithographic apparatus may comprise measuring the aberration for one or more exposure settings of the lithographic apparatus, e.g. to measure a response of the projection system to the one or more exposure settings. For example, an input associated with an exposure setting may be applied to the projection system and the aberration may be measured to obtain the aberration signal. A fast-dynamic model may be generated during calibration using the first component of the aberration signal, as described above. Measuring the aberration during calibration of the lithographic apparatus may comprise exposing a lot of substrates selected for calibration of the lithographic apparatus. The lot of substrates selected for calibration of the lithographic apparatus may comprise a lot of substrates dedicated for calibration. The lot of substrates selected for calibration of the lithographic apparatus may not be used during production of commercial substrates. This may allow a calibration sequence to be more complex. For the examples, the calibration sequence may comprise additional measurements of the aberration, for example during a cool down period of the projection system. The use of the lot of substrates selected for calibration may reduce the number of commercial substrates that may be wasted during calibration or may prevent any commercial substrates from being used during calibration.

FIG. 6 depicts the output M2 of the fast-dynamic model. The generated fast-dynamic model may be configured to at least partially predict a response of the projection system of the lithographic apparatus during exposure of one or more lots of substrates are exposed. For example, the generated fast-dynamic model may be configured to predict a response of the projection system during exposure of a lot of substrates or at a transition between two lots of substrates. During exposure or at the transition between two lots of substrates, the fast-heating dynamics may be considered as being prevailing or dominant.

As described above, the fast-dynamic model may be generated using the first component of the aberration signal. For example, the method may comprise using a filter to apply a weighting, such as a frequency-dependent weighting, to the aberration signal. The weighting may be applied to the aberration signal prior to calculating the first part of the correction, e.g. generation of the fast-dynamic model. In other words, the method may include an intermediate step, during which the filter or weighting is applied to the aberration signal. A frequency range of weighting may be selected such that the part of the calculated correction is based on the first component of the aberration signal and the second component of the aberration signal is disregarded for the calculation of the part of the correction.

It will be appreciated that in other examples the fast-dynamic model may be generated using the first and second components of the aberration signal. In such example, the frequency range of the weighting may be selected such that a component of the generated model that comprises the second frequency or frequency band is suppressed or disregarded for the calculation of the first part of the correction. The component of the generated model that comprises the second frequency or frequency band may be, comprise or correspond to the second component of the aberration signal. The component of the generated model that comprises the second frequency or frequency band may be referred to as the second component of the generated model. The step of applying the weighting may then be part of or comprised in the step of calculating the first part of the correction.

Referring to the amplitude spectra depicted in FIGS. 5a and 5b, the first component of the aberration signal comprises the first frequency band. The first frequency band may have a minimum frequency and a maximum frequency. The minimum frequency of the first frequency band may be or comprise a frequency that is equal to or above the threshold frequency, as described above. For example, the minimum frequency $\omega_{min}$ may be selected as about 0.01 rad/s. The maximum frequency of the first frequency band may be or comprise a sampling frequency $\omega_s$. For example, the first component of the aberration signal may have a first frequency band or range of:

$$\omega = \left[\omega_{min}, \frac{\omega_s}{2}\right] = \left[0.01, \frac{\pi}{T_s}\right] \quad (3)$$

where $\omega_s$ is the sampling frequency and $T_s$ is the sampling time. A base frequency $\omega_b$ of the exposure sequence depicted in FIG. 3a may equal $$\omega_b = \frac{2\pi}{18\,T_s} = 0.0233 \text{ rad/s}$$

(whereby in the example of FIG. 3, each lot comprises 18 substrates). The base frequency may be considered as corresponding to the frequency at which a lot of substrates is exposed. The base frequency $\omega_b$ is indicated in the amplitude spectrum depicted in FIG. 5a. It can be seen from FIGS. 5a and 5b that $\omega_b > \omega_{min}$. For an example in which 25 substrates are exposed per lot, a wafer-by-wafer (WbW) measurement interval of 14.4 seconds, and a system and lot correction (SyCo & LoCo) duration of about 40 second in between lots, the base frequency can be calculated as $\omega_b \approx 2\pi(25 \cdot 14.4+40)$ =0.0157 rad/s, which is larger than the minimum frequency of about 0.01 rad/s. It should be understood that the first frequency band disclosed herein is not limited to having the exemplary minimum and/or maximum frequency described above and that other values for the minimum and/or maximum frequency may be selected. For example, the minimum and/or maximum frequency may be selected based on a desired accuracy of the fast-dynamic model and/or a desired amount of data available for the generation of the fast-dynamic model. Alternatively or additionally, it will be appreciated that the first frequency band may be selected based on the first and/or second time constants, which may be obtained by fitting of the aberration signal. Although the filter is described above as applying a weighting, it will be appreciated that the filter may be configured to allow passage of a component of the aberration signal or generated model that has a frequency that is equal to or higher than the minimum frequency $\omega_{min}$ of the first frequency band. Any components of the aberration signal or generated model that has a frequency below the minimum frequency $\omega_{min}$ may be attenuated or suppressed. For example, the filter may comprise a high-pass filter. Alternatively or additionally, the filter may be configured to allow passage of a component of the aberration signal or generated model that has a frequency that is equal to or higher than the minimum frequency and equal to or below the maximum frequency of the first frequency band. The filter may define a passband, which extends between the minimum and maximum frequencies of the first frequency band.

Figure 7A:
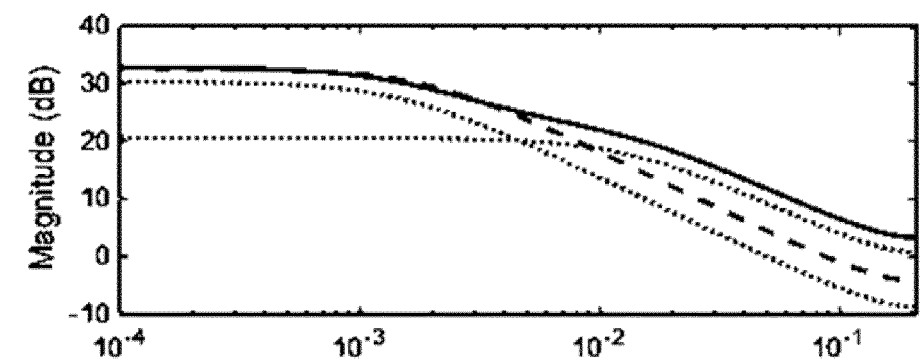
FIGS. 7a and 7b depict Bode diagrams of a comparison between a simulated aberration signal and an output of an unweighted model.
Figure 7B:
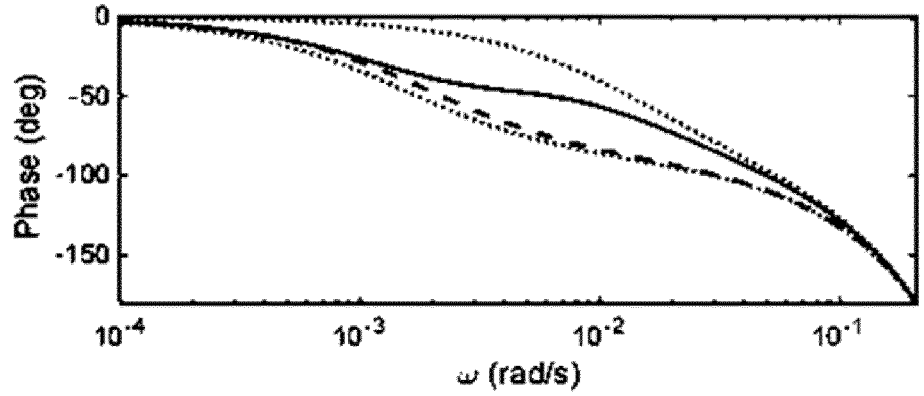

FIGS. 7a and 7b depict Bode diagrams of a simulated aberration signal (illustrated by the solid line) and an output of a lens heating model, which in this example is in the form of a second order LTI model, (illustrated by the dashed line) which has been generated based on an unweighted aberration signal, i.e. no weighting or filtering was applied to the simulated aberration signal. The aberration signal may be simulated for an aberration having a Z5 Zernike coefficient and a zero field order. The simulated aberration signal may be considered to substantially correspond to an aberration signal obtained from aberration measurement by the sensor S. The first and second components of the simulated aberration signal are indicated in FIGS. 7a and 7b by dotted lines. The first component of the stimulated aberration signal has in this example a magnitude of 20 dB at a frequency of $10^{-4}$ rad/s and the second component has in this example a magnitude of 30 dB at a frequency of $10^{-4}$ rad/s. From FIGS. 7a and 7b it can be seen that if no weighting is applied to the simulated aberration signal, the lens heating model predicts the second component, e.g. a low frequency component, of the simulated aberration signal but does not predict the first component of the simulated aberration signal, e.g. a high frequency component, of the simulated aberration signal. This may be due to the second component of the simulated aberration signal, e.g. the slow heating dynamics, having a larger amplitude than the first component of the aberration signal, e.g. the fast heating dynamics, i.e. $\mu_2 > \mu_1$ ($\tau_2 > \tau_1$) of Equation 2 above. Thus, to minimize the mismatch between the simulated aberration signal and the model, the model is allowed to describe the second component, e.g. the slow heating dynamics.

Figure 7C:
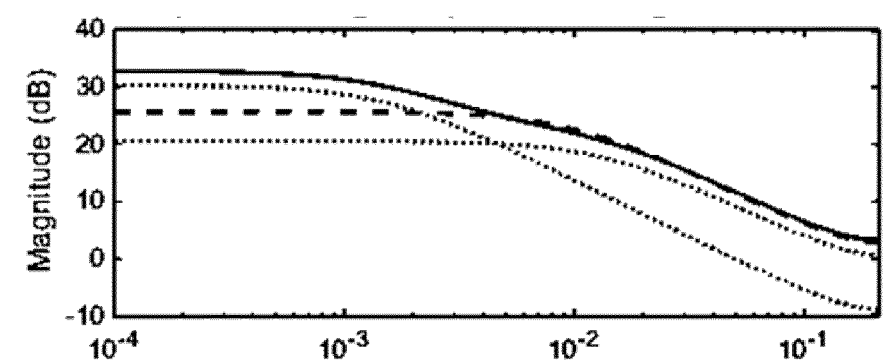
FIGS. 7c and 7d depict Bode diagrams of a comparison between a simulated aberration signal and an output of a weighted model generated by the method of FIG. 4.
Figure 7D:
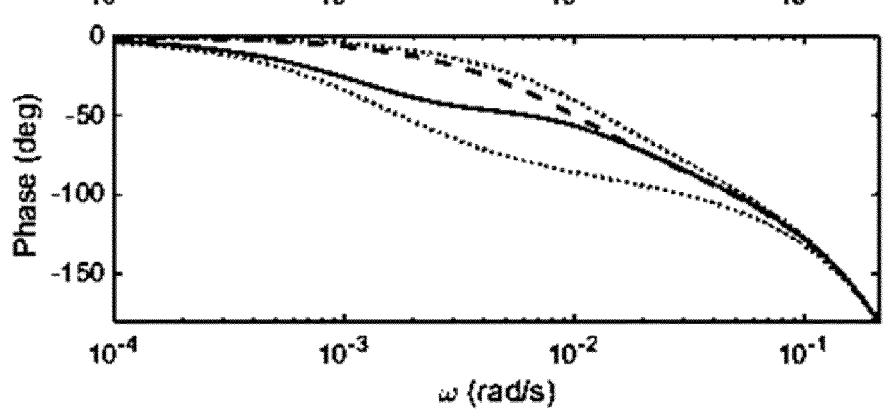

FIGS. 7c and 7d depict Bode diagrams of the simulated aberration signal (illustrated by the solid line) and an output of the fast-dynamic model (illustrated by the dashed line) which has been generated based on first component of the simulated aberration signal, i.e. a weighting was applied to the simulated aberration signal, as described above. From FIGS. 7c and 7d it can be seen that if the weighting is applied to the simulated aberration signal to disregard or suppress the second component of the simulated aberration signal, then the generated fast-dynamic model describes the high-frequent component, e.g. the fast heating dynamics. It will be appreciated that the weighting may be selected such that either the first component or the second component of the simulated aberration signal may be suppressed or attenuated. It will be appreciated that the weighting may be applied to an aberration signal of a measured aberration in a same or similar manner.

By calculating a first part of the correction based on the first component of the aberration signal, as discussed above, a model describing the fast-heating dynamics of the projection system may be obtained. This may allow a first part of a correction to be calculated without the need for dedicated calibration of the lithographic apparatus to obtain a model that accurately describes the complete lens heating behavior of the projection system. By calculating the first part of the correction based on the first component of the aberration signal, the first part of the correction may be calculated subsequent to exposure of at least one or two lots of substrates. This may allow the first part of the correction to be calculated during or subsequent to regular exposure of the lot of substrates. Additionally or alternatively, the time frame used to calculate a first part of the correction may be reduced compared to the time frame required for obtaining an accurate lens heating model using calibration of the lithographic apparatus. For example, the time frame used to calculate the first part of the correction may be ten times (10×) the slowest time constant of the response of the projections system to heat applied to the projection system, e.g. during exposure of a lot of substrates.

Additionally or alternatively, due to the fast-dynamic model being based on the first component of the aberration signal, the complexity of the fast-dynamic model may be reduced. For example, the fast-dynamic model may be described by a first order LTI model. This may reduce the risk of overfitting the aberration signal.

Figures 8A, 8B:
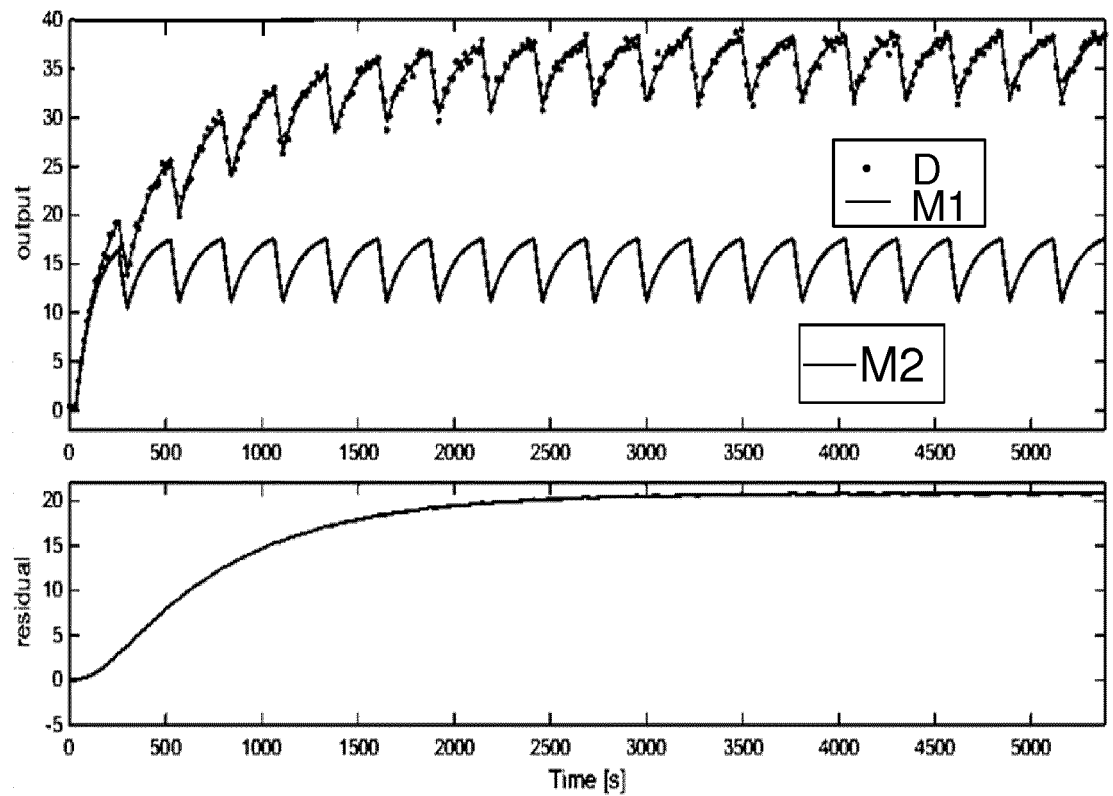
FIG. 8a depicts a comparison between an aberration signal obtained from aberration measurements and a model generated by the method of FIG. 4.
FIG. 8b depicts a diagram of a residual between the aberration signal of FIG. 8a and an output of the model generated by the method of FIG. 4.

The step of calculating the correction of the exemplary method depicted in FIG. 4 may comprise calculating a second part of the correction. Calculating the second part of the correction may comprise subtracting the generated output of the fast-dynamic model from the aberration signal to obtain a residual, which is depicted in FIG. 8*b*. FIG. 8*a* corresponds to FIG. 6 and is depicted for clarity purposes. It can be seen from FIG. 8*b* that the residual has a time constant that is longer than the first time constant. For example, the time constant of the residual may correspond to the second time constant of the second component of the aberration signal. In other words, the residual has a frequency that is lower than the first frequency or the frequencies comprised in the first frequency band. Alternatively, the residual may have a frequency band comprising frequencies that are lower than the first frequency or the frequencies comprised in the first frequency band. The frequency or frequency band of the residual may correspond to the second frequency or second frequency band, respectively.

The step of calculating the second part of the correction may comprise applying a filter to the residual. For example, the residual may be filtered using exponential smoothing, e.g. basic exponential smoothing. Exponential smoothing may, for example, be described by $$x(k)=(1-\alpha) \cdot x(k-1)+\alpha \cdot m(k) \tag{4}$$

in which x is the filtered residual, $\alpha$ is the filter gain and m the residual. The correction may then be calculated by adding the filtered residual x to the output of the fast-dynamic model.

As described above, in examples, where the aberration was measured for two lots of substrates or more than two lots of substrates, the fast dynamic model may be generated after exposure of the first lot of substrates and/or each lot of substrates that follows the first lot of substrates exposed by the lithographic apparatus using the aberration signal obtained for the first lot of substrates and/or the aberration signal obtained for one or more lots following the first lot of substrates. This may lead to an increase in accuracy of the generated model, as described above. Once a fast-dynamic model with a pre-determined accuracy has been obtained, the output generated by the fast-dynamic model may be subtracted from the aberration signal to obtain the residual. The filter may subsequently be applied to the residual, as described above. An increase in the accuracy of the fast-dynamic model may allow the filter gain $\alpha$ to be decreased. For example, for a given lot i (i>2), the model may be generated for i-1 and the filter is applied to all lots smaller or equal to i. For the lots that are smaller or equal to i an optimal filter gain $\alpha$ may be determined.

Although the use of exponential smoothing of the residual has been described above to filter the residual, it will be appreciated that the exemplary method described herein is not limited to such filtering. For example, the filter that may be applied as part of the calculation of the second part of the correction of the exemplary method disclosed herein may comprise an alpha-beta filter. In such examples, applying the filter to the residual may comprise differentiating the residual to obtain a time derivative of the residual. Based on the time derivative of the residual, at least a component of the aberration signal for a lot of substrates that has not yet been exposed by the lithographic apparatus may be predicted, as will be described below.

Applying the alpha-beta filter may include applying a velocity state to the fast-dynamic model. The velocity state can be considered as an estimation of the derivative of the residual. The derivative may be used for a linear extrapolation to obtain a prediction of the projection system aberration at the next time instance, e.g. at the next lot to be exposed. In other words, the residual may be calculated after exposure of a first lot of substrates or after exposure of each lot of substrates that follows the first lot of substrates, as described above. The calculated residual may be differentiated over time to obtain a forward prediction of the residual of generated after exposure of a subsequent lot of substrates. The prediction may result in improved filtering, for example, compared to using exponential smoothing. For example, the alpha-beta filter may be considered as taking into account changes or a drift of the aberration signal, e.g. due to the slow-heating dynamics of projection system, which may not be taken into account in exponential smoothing.

The alpha-beta ($\alpha$–$\beta$) filter may be considered as using velocity states. The $\alpha$ filter may be the same as an exponential smoothing filter. The $\alpha$–$\beta$ filter can be described using a general innovation predictor model:

$$\hat{x}(k+1)=A\hat{x}(k)+K(y(k)-C\hat{x}(k)) \tag{5}$$

$$\hat{y}(k)=C\hat{x}(k) \tag{6}$$

in which A and C are the system matrices, K is the filter gain, $\hat{x}$ is the estimated state vector, $\hat{y}$ is the estimated residual and y is the residual.

The $\alpha$ filter may be obtained by applying the following system matrices:

$$A=1, C=1, K=\alpha \tag{7}$$

The $\alpha$–$\beta$ filter has an extra velocity state and has the following matrices:

$$A=[1 \Delta T; 0\ 1],$$

$$C=[1\ 0],$$

$$K=[\alpha\ \beta],$$

$$\hat{x}=[\hat{x}\_1;\ \hat{x}\_2] \tag{8}$$

whereby $z(k)=\hat{x}\_1(k+1)$ is the filtered residual, which may have reduced noise compared to the original residual. The state $\hat{x}\_2$ may be used for forward predictions. For example, the state $\hat{x}\_2$ may be used for forward predictions of the second component of the aberration signal or the residual. Kalman filtering may be applied to calculate the filter gains K. This may lead to an optimal estimator, for which the filter results have a zero-mean and minimum variance error.

In the above described exemplary method, the exposure sequence may be considered as being configured for Single-Input Single-Output (SISO) applications of the lithographic apparatus. In such applications, the lithographic apparatus may produce/expose a plurality of lots of the same type. In other words, each lot of substrates is exposed with the same exposure settings. However, it will be appreciated that the above method may also be applicable to Multi-Input Single-Output (MISO) and/or Multi-Input-Multi-Output (MIMO) applications of the lithographic apparatus. In MISO/MIMO applications, the lithographic apparatus may produce/expose a plurality of lots of different types. In other words, each lot of substrates may be exposed with a different exposure setting, which may be associated with a respective input. For example, a first input associated with a first exposure setting may be applied to the lithographic apparatus, e.g. the projection system, to expose a first lot of substrates. A second input associated with a second exposure setting that differs from the first exposure setting may be applied to the lithographic apparatus, e.g. the projection system, to expose a second lot of substrates.

The step of calculating the first part of the correction of the method depicted in FIG. 4 may comprise identifying an application of the lithographic apparatus. In other words, the step of calculating the first part of the correction may comprise identifying whether a SISO, MISO or MIMO application of the lithographic apparatus is used to expose a plurality of lots of substrates. The application of the lithographic apparatus may be determined using the system identification method. For example, when a MISO application of the lithographic apparatus has been determined, the system identification method may be used to correlate the aberration signal to the plurality of inputs applied to the lithographic apparatus, e.g. the projection system. This may include decomposing the aberration signals into a plurality of further components. Each further component of the aberration signal may be associated with a respective input. Each further component may be further decomposed into one or more parts or coefficients, such as for example one or more Zernike coefficient, as described above. Each further component of the aberration signal may correspond to or be associated with at least one part or coefficient. The at least one or each part or coefficient of the further component may comprise or define the first and second components. Based on the first component, a fast-dynamic model may be generated for each input applied to the lithographic apparatus, as described above in relation to the SISO application.

In MIMO applications of the lithographic apparatus, a plurality of aberration signals may be obtained from the aberration measurement. The plurality of aberration signal may be associated with a plurality of parts or coefficients, such as for example Zernike coefficients or SVD modes, as described above. The system identification method may be used to cross-correlate the plurality of the aberration signals obtained from measuring the aberration. Based on the first component of each aberration signal, a fast-dynamic model may be generated for each aberration signal, as described above for the SISO or MISO application.

Figures 9A, 9B:
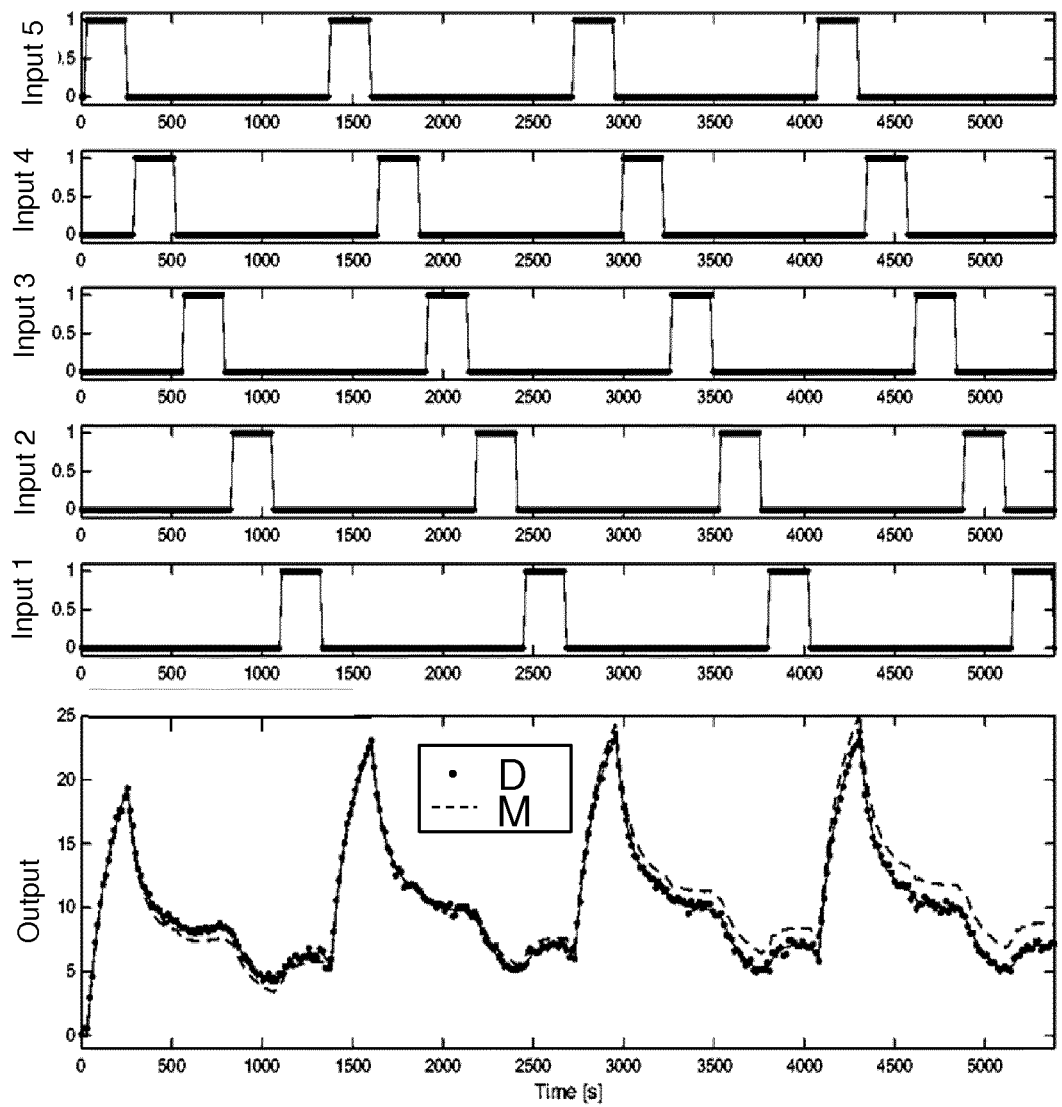
FIG. 9a depicts inputs to the lithographic apparatus of FIG. 1 for a MISO application.
FIG. 9b depicts a comparison between an aberration signal obtained from aberration measurements and an output of a known model for a MISO application of the lithographic apparatus.

FIG. 9a shows a MISO application of the lithographic apparatus having five exemplary inputs. Each input comprises or defines a respective exposure sequence. It will be appreciated that in other examples more or less than five inputs may be used. FIG. 9b depicts a comparison between the data D obtained from aberration measurements, for example performed by sensor S, and an output M1 of one of the lens heating model described above. The lens heating model used to describe the aberration signal obtained from data D is indicated in FIG. 9b by the dashed line. It can be seen in FIG. 9b that the model does not fully describe the aberration signal obtained from data D due to the model being generated for all frequencies of the aberration signal.

Figures 10A, 10B:
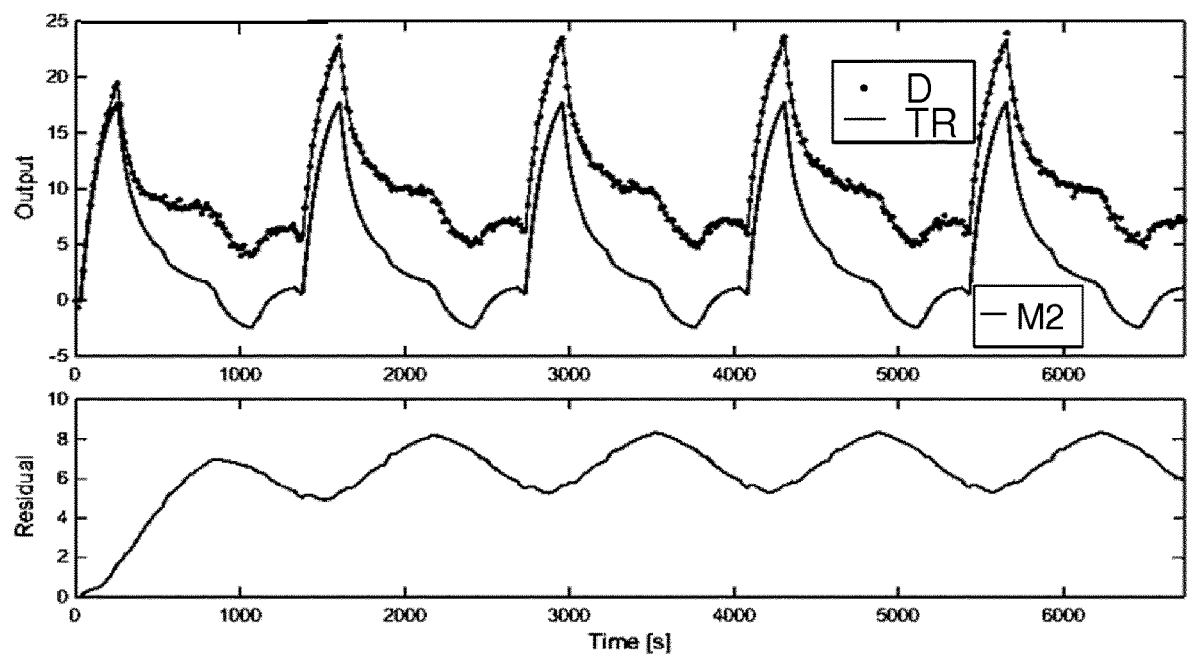
FIG. 10a a comparison between an aberration signal obtained from aberration measurements and an output of a model generated by the method of FIG. 4 for a MISO application of the lithographic apparatus.
FIG. 10b depicts a diagram of a residual between the aberration signal of FIG. 10a and the output of the model generated according to the method of FIG. 4.

FIG. 10a depicts the aberration data D, which provides an aberration signal, measured for the MISO application of the lithographic apparatus depicted in FIG. 9a. FIG. 10a also depicts a true response TR of the projection system. FIG. 10a further depicts an output M2, which includes a combination of the fast-dynamic models that were generated for each input. From FIG. 10a it can be seen that the combination of fast-dynamic models (output M2) may be used to describe the fast dynamics of the projections system for a MISO application of the lithographic apparatus.

FIG. 10b depicts a residual that was obtained by subtracting the output M2 of the fast-dynamic model from the aberration signal. It can be seen from FIG. 10b that the residual has a time constant that is longer than the time constant of the first component. A filter may be applied to the residual as described above.

Applying the calculated correction to the lithographic apparatus may comprises manipulating lenses of the projection system. Applying the calculated correction may further comprise adjusting the position or orientation of the mask or the wafer. Applying the calculated correction may further comprise adjusting the wavelength of the radiation used by the lithographic apparatus.

It will be appreciated that aspects of the present invention can be implemented in any convenient way including by way of suitable hardware and/or software. For example, a device arranged to implement the invention may be created using appropriate hardware components. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of reducing an aberration in a projected image, the method comprising:
    measuring the aberration to obtain an aberration signal, the aberration signal comprising a first component and a second component, wherein the first component of the aberration signal comprises a first frequency band and the second component of the aberration signal comprises a second frequency band, wherein the first frequency band comprises frequencies that are higher than frequencies comprised in the second frequency band;
    calculating a correction, wherein a first part of the correction is calculated based on the first component of the aberration signal after using a filter to apply a weighting to the aberration signal; and
    applying the correction to a lithographic apparatus.

2. The method of claim 1, wherein the first frequency band and/or second frequency band is indicative of a response of a projection system of the lithographic apparatus during exposure of at least one lot of substrates or a plurality of lots of substrates by the lithographic apparatus.

3. The method of claim 1, wherein the method comprises measuring the aberration for one or more exposure settings of the lithographic apparatus to measure a response of a projection system to the one or more exposure settings.

4. The method of claim 1, wherein the method comprises obtaining or determining the aberration signal from the measured aberration by decomposing the measured aberration into one or more parts or coefficients, the aberration signal corresponding to or being associated with at least one part or coefficient of the measured aberration.

5. The method of claim 1, wherein the frequencies of the first frequency band are above a threshold frequency, and the frequencies of the second frequency band are below the threshold frequency.

6. The method of claim 5, wherein the threshold frequency is selected dependent on a sampling time of the lithographic apparatus.

7. The method of claim 1, wherein calculating the first part of the correction comprises generating a model using the first component and/or the second component of the aberration signal.

8. The method of claim 7, wherein generating the model comprises generating the model after a first lot of substrates or a predetermined number of lots of substrates has been exposed by the lithographic apparatus.

9. The method of claim 7, wherein the model is configured to at least partially predict a response of a projection system of the lithographic apparatus during exposure of one or more lots of substrates by the lithographic apparatus and/or at a transition between at least two lots of substrates exposed by the lithographic apparatus.

10. The method of claim 7, wherein an output generated by the model comprises the first component of the aberration signal and/or the first frequency band.

11. The method of claim 10, wherein:
calculating the correction comprises calculating a second part of the correction, and
calculating the second part of the correction comprises subtracting the output from the aberration signal to obtain a residual.

12. The method of claim 11, wherein calculating the second part of the correction comprises applying an additional filter to the residual.

13. The method of claim 12, wherein the additional filter comprises exponential smoothing or an alpha-beta filter.

14. The method of claim 12, wherein applying the additional filter to the residual comprises differentiating the residual to obtain a time derivative of the residual, and predicting at least a component of an aberration signal for a lot of substrates that has not yet been exposed by the lithographic apparatus, based on the time derivative of the residual.

15. The method of claim 12, wherein calculating the correction comprises adding the first part of the correction to the second part of the correction.

16. The method of claim 1, wherein a frequency range of the weighting is selected such that the first part of the correction is calculated based on the first component of the aberration signal and the second component of the aberration signal is suppressed or disregarded for the calculation of the first part of the correction.

17. The method of claim 1, wherein the filter comprises a high-pass filter.

18. The method of claim 1, wherein applying the calculated correction to the lithographic apparatus comprises at least one of manipulating lenses of the projection system, adjusting the position or orientation of a mask or wafer, and adjusting a wavelength of radiation used by the lithographic apparatus.

19. A lithographic apparatus comprising a projection system configured to project a pattern from a mask onto a substrate, the lithographic apparatus further comprising:
a sensor configured to measure an aberration caused by the projection system and/or the mask used by the lithographic apparatus, wherein:
an aberration signal obtained from the measured aberration comprises a first component and a second component,
the first component of the aberration signal comprises a first frequency band and the second component of the aberration signal comprises a second frequency band, and
the first frequency band comprises frequencies that are higher than frequencies comprised in the second frequency band;
a processor configured to calculate a correction to be applied to the projection system, wherein the processor is configured to calculate a first part of the correction based on the first component of the aberration signal after using a filter to apply a weighting to the aberration signal; and
lens manipulators configured to apply the correction by manipulating lenses of the projection system.

* * * * *